United States Patent [19]
Buer et al.

[11] Patent Number: 6,114,880
[45] Date of Patent: *Sep. 5, 2000

[54] DYNAMIC OVER FREQUENCY DETECTION AND PROTECTION CIRCUITRY

[75] Inventors: Mark Leonard Buer, Chandler; Bing Yup, Phoenix, both of Ariz.

[73] Assignee: Philips Semiconductor VLSI, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/816,903

[22] Filed: Mar. 14, 1997

[51] Int. Cl.$^7$ ......................................................... H03K 7/06
[52] U.S. Cl. .................................. 327/39; 327/43; 327/47; 327/49
[58] Field of Search .................................. 327/39, 40, 41, 327/42, 43, 47, 49, 48

[56] References Cited

U.S. PATENT DOCUMENTS

| | | | |
|---|---|---|---|
| 3,959,731 | 5/1976 | Pomerantz et al. | 327/41 |
| 3,971,994 | 7/1996 | Shepard | 327/43 |
| 4,362,957 | 12/1982 | Stem | 327/41 |
| 4,564,837 | 1/1986 | Awano | 327/39 |
| 4,691,382 | 9/1987 | Nakajima | 455/343 |
| 4,988,901 | 1/1991 | Kamuro et al. | 327/18 |
| 5,572,719 | 11/1996 | Smith | 327/42 |
| 5,708,375 | 1/1998 | Lemmens | 327/36 |
| 5,834,959 | 11/1998 | Ritter et al. | 327/176 |

*Primary Examiner*—Tuan T. Lam

[57] ABSTRACT

An over frequency detection circuit which is based on the concept of a critical path in a design to protect an IC chip from running at a rate which will produce unpredictable results. The over frequency detection circuit will compare the output of a critical path generation circuit with that of a known path generation circuit. The known path generation circuit must have a delay which is guaranteed to be much shorter than the delay of the critical path generation circuit. If the output of the critical path generation circuit is not the same as the output of the known path generation circuit, then the critical path generation circuit has begun to fail and the IC chip should be disabled.

21 Claims, 1 Drawing Sheet

6,114,880

DYNAMIC OVER FREQUENCY DETECTION AND PROTECTION CIRCUITRY

FIELD OF THE INVENTION

This invention relates generally to frequency monitors and, more specifically, to a dynamic over frequency detection circuit that uses the concept of the critical path in a system to protect against running an integrated circuit (IC) chip in the system at a clock rate that will produce unpredictable results.

BACKGROUND OF THE INVENTION

Presently, when an integrated circuit (IC) chip receives a clock signal which is higher than the normal clock rate, the chip may generate unpredictable results due to variations in voltage, temperature, and process manufacturing. For this reason, a high frequency monitor is generally implemented in most IC designs. The high frequency monitor is used to turn off the clock signal to an IC chip when the frequency exceeds a predetermined value which may cause the IC chip to generate unpredictable results.

Presently, most high frequency monitors are comprised of two basic components: a ring oscillator and a clock comparison circuit. The ring oscillator is used to provide a know reference frequency. The clock comparison circuit is used to compare the reference clock signal from the ring oscillator to that of the clock signal being sent to the IC chip and to ensure that the clock signal to the IC chip is within the bounds of the reference clock signal.

While current high frequency monitors which use a ring oscillator and a clock comparison circuit do work, they have several problems associated with them. The main problem with high frequency monitors which use a ring oscillator is that they are very inaccurate. These systems have a variance of two (2) times the clock variance. These inaccuracies place a limit on how close a clock signal may come to the detection frequency of the IC chip. Another problem with these types of high frequency monitor circuits is that they consume large amounts of power which may decrease the efficiency of the system using the high frequency monitor circuit. A further problem with high frequency monitors which use a ring oscillator is that these systems require the use of a set frequency. Once the ring oscillator is set in silicon, the frequency of the ring oscillator cannot be altered. Thus, even if the IC chip is able to run at different frequencies, a high frequency monitor which use a ring oscillator cannot be altered to monitor the different operating frequencies of the IC chip.

Therefore, a need existed to provide an improved over frequency detection circuit. The improved over frequency detection circuit must be more accurate than current high frequency monitors which use a ring oscillator and a comparison circuit. The improved over frequency detection circuit must further provide a low power way to ensure that IC chips do not generate unpredictable results at a frequency higher than the normal clock rate. The improved over frequency detection circuit must be dynamic. The improved over frequency detection circuit must allow an IC chip to run at the chip's maximum attainable frequency, while requiring no advance knowledge of the maximum chip frequency.

SUMMARY OF THE INVENTION

In accordance with embodiments of the present invention, the present invention provides an improved over frequency detection circuit.

The present invention also provides an improved over frequency detection circuit that is more accurate than current high frequency monitors which use a ring oscillator and a comparison circuit.

and that provides a low power and dynamic method to ensure that IC chips do not generate unpredictable results at a frequency higher than the normal clock rate.

The present invention further provides an improved over frequency detection circuit that allows an IC chip to run at the chip's maximum attainable frequency, while requiring no advance knowledge of the maximum chip frequency.

In accordance with a specific example embodiment of the present invention, an over frequency detection circuit uses a critical path generation circuit for implementing a pathway approximately equal to a longest delay path that will allow a system using the over frequency detection circuit to operate in a known state and still obtain predictable results. The over frequency detection circuit also uses a known path generation circuit for implementing a shorter pathway than the critical path generation circuit. A comparator circuit is coupled to an output of the critical path generation circuit and to an output of the known path generation circuit. The comparator is used to compare the output of the critical path generation circuit to the output of the known path generation circuit. The comparator circuit will generation a frequency error signal when the output of the critical path generation circuit is different from the output of the known path generation circuit indicating that the critical path generation circuit is failing. A protection circuit having an input coupled to an output of the comparator circuit and an output coupled to an integrated circuit (IC) chip may further be provided. The protection circuit is used for sending a signal to disable the IC chip when the protection circuit receives the frequency error signal indicating that the critical path generation circuit is failing.

The foregoing and other aspects, features, and advantages of the invention will be apparent from the following, more particular, description of the preferred embodiments of the invention, as illustrated in the accompanying drawings.

DETAILED DESCRIPTION

Figure 1:
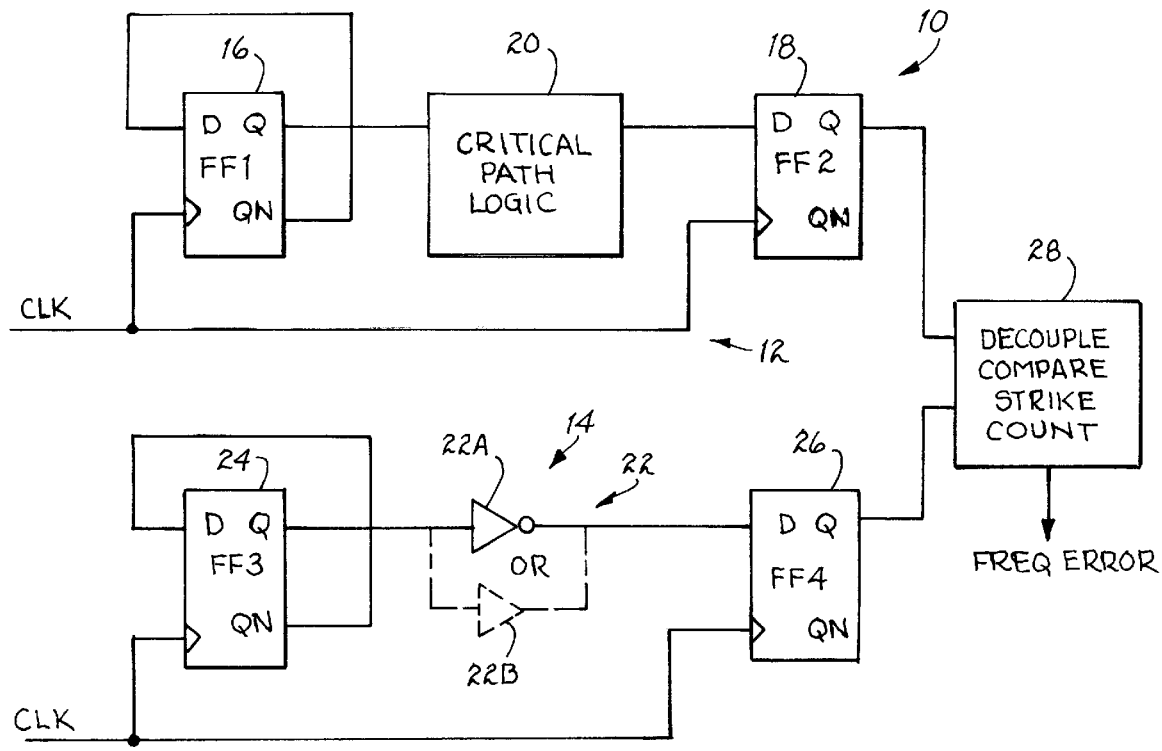
FIG. 1 is a simplified functional block diagram of the over frequency detection circuit of the present invention.

Referring to FIG. 1, an over frequency detection circuit 10 (hereinafter circuit 10) is shown. The circuit 10 is based on the concept of a critical path in a design to protect an IC chip from running at a rate that will produce unpredictable results. The basic premise of the circuit 10 is to compare the output of a critical path generation circuit 12 with that of a known path generation circuit 14. The known path generation circuit 14 must have a delay which is guaranteed to be much shorter than the delay of the critical path generation circuit 12. If the output of the critical path generation circuit 12 is not the same as the output of the known path generation circuit 14, then the critical path generation circuit 12 has begun to fail and the IC chip should be disabled.

In a synchronous system using the circuit 10, there is generally going to be a pairs of registers through which data will be transferred. Between the pairs of registers, there is generally going to be groups of combinational logic which are going to perform predetermined functions between the registers. The critical path of the system relates to the longest delay path between any pair of registers that will allow the system to operate in a known state and still obtain predictable results.

In the embodiment shown in FIG. 1, a single pair of registers 16 and 18 are shown. The first register 16 is implemented using a flip flop. The register 16 flip flop is then coupled to a clock signal CLK so that data may be latched into the first register 16 flip flop during transitions of the clock signal CLK. The output Q of the first register 16 flip flop is coupled to an input of the critical path logic circuit 20. An inverse output QN of the first register 16 flip flop is fed back to an input D of the first register 16 flip flop. In this embodiment, the second register 18 is also a flip flop. The output of the critical path logic circuit 20 is fed to the input D of the second register 18 flip flop. The register 18 flip flop is also coupled to the clock signal so that data may be latched into the second register 18 flip flop during transitions of the clock signal. The second register 18 flip flop is used to implement an extra delay (i.e., at least the hold time of the second register 18 flip flop) so that the results of the second register 18 flip flop will be reliable at the frequency of interest. This will force a miscompare with the known path generation circuit 14 when the critical path logic circuit 20 begins to fail.

As stated above, coupled between the two registers 16 and 18 is a critical path logic circuit 20. The critical path logic circuit 20 corresponds to the longest delay path within the system using the circuit 10 that will allow the system to operate in a known state and still obtain predictable results. The critical path logic circuit 20 may be an exact replication of the combinational logic which relates to the longest delay path between any pair of registers, or the critical path logic circuit 20 may be a delay circuit which will duplicate the length of time of the longest delay path between any pair of registers within the system. While the circuit 10 will function better with an exact replication of the combinational logic, it is not required. The critical path logic circuit 20 duplicates the longest delay path between any pair of registers within the system.

Matched up with the critical path generation circuit 12 is the known path generation circuit 14. The known path generation circuit 14 must have a delay which is guaranteed to be much shorter than the delay of the critical path generation circuit 12. The known path generation circuit 14 is basically comprised of a logic buffer 22 positioned between two registers 24 and 26.

In this embodiment, the register 24 is implemented using a flip flop. The register 24 flip flop is coupled to the clock signal CLK so that data may be latched into the register 24 flip flop during transitions of the clock signal CLK. The output Q of the register 24 flip flop is coupled to an input of the-logic buffer 22. An inverse output QN of the register 24 flip flop is fed back to an input D of the register 24 flip flop. In this embodiment, the register 26 is also a flip flop. The output of the logic buffer 22 is fed to the input D of the register 26 flip flop. The register 26 flip flop is also coupled to the clock signal so that data may be latched into the register 26 flip flop during transitions of the clock signal.

The logic buffer 22 generates a delay which is guaranteed to be much shorter than the delay of the critical path generation circuit 12. In accordance with one embodiment shown in FIG. 1, the logic buffer 22 is an inverting buffer 22A having an input coupled to the output Q of the register 24 flip flop and an output coupled to the input D of the register 26 flip flop. In accordance with another embodiment shown in FIG. 1, the logic buffer 22 is a non-inverting buffer 22A having an input coupled to the output Q of the register 24 flip flop and an output coupled to the input D of the register 26 flip flop. The use of an inverting buffer 22A or a non-inverting buffer 22B is based on whether the critical path logic circuit 20 is inverting or non-inverting.

The output from the critical path generation circuit 12 and the output of the known path generation circuit 14 are then sent to a comparator circuit 28. The two output signals will be compared by the comparator circuit 28. The known generation path will operate at a much faster rate than the critical path generation circuit 12 since there is very little delay caused by the logic buffer 22. If the two output signals are the same, then the critical path generation circuit 12 is functioning properly. However, if the two signals are different, then the critical path generation circuit 12 is beginning to fail. The comparison is then decoupled by the comparator circuit 28 from the registers 18 and 26 to ensure that there are no meta-stable events in the results. In accordance with one embodiment of the present invention, the decoupling is accomplished through the use of a flip flop. The result of the comparison is then recorded by a counting mechanism within the comparator circuit 28. After a predetermined number of mismatches (i.e., one or more depending on the desire of the user), the comparator circuit 28 will generate a frequency error signal. The counter mechanism of the comparator circuit is used to ensure that the circuit 10 is not continuously causing errors in the system.

Figure 2:
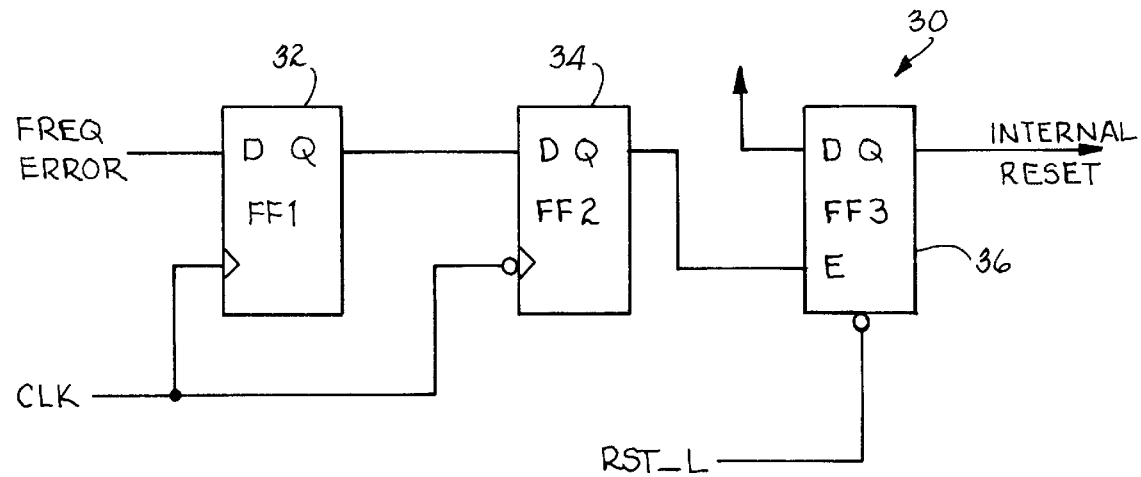
FIG. 2 is a simplified functional block diagram of a protection circuit used in conjunction with the over frequency detection circuit of FIG. 1 to disable an IC chip from operating at a high frequency and possibly generating unpredictable results.

Referring now to FIGS. 1 and 2, the frequency error signal generated by the comparator circuit 28 is then sent to a protection circuit 30. The protection circuit 30 has an input coupled to an output of the comparator circuit 28 and an output coupled to an integrated circuit (IC) chip (not shown) for sending a signal to disable the IC chip when the critical path logic circuit 20 begins to fail. In accordance with one embodiment of the present invention, the protection circuit 30 is comprised of a first flip-flop 32 having a first input D coupled to the output of the comparator circuit 28 and a second input coupled to the clock signal CLK for receiving the frequency error signal outputted by the comparator circuit 28. A second flip flop 34 is further provided and has a first input D coupled to an output Q of the first flip flop 32 and a second input coupled to the clock signal CLK. The second flip flop 34 is used for decoupling the frequency error signal to ensure that there are no meta-stable events. A third flip flop 36 is further provided and has an enable input E coupled to an output Q of the second flip flop 34. The third flip flop 36 is used for sending an internal reset signal to disable an IC chip and for continuing to disable the IC chip until a reset signal RST_L is sent to the third flip flop 36 to reset and clear the third flip flop 36. Thus if an IC chip is running at a higher frequency than it is suppose to (i.e., failure of the critical path logic circuit 20), the protection circuit 30 will disable the IC chip until the flip flop 36 is reset. Thus at high frequencies, the IC chip cannot run and generate unknown results.

While the invention has been particularly shown and described with reference to preferred embodiments thereof, it will be understood by those skilled in the art that the foregoing and other changes in form, and details may be made therein without departing from the spirit and scope of the invention.

What is claimed is:

1. An over frequency detection circuit comprising, in combination:

a first path generation circuit configured and arranged to implement a pathway about equal to a longest delay path in a system using said over frequency detection circuit that will allow said system to operate in a known state and still obtain predictable results;

known path generation circuit for implementing a shorter pathway than said the first path generation circuit; and a comparator coupled to an output of said the first generation circuit and to an output of the known path generation circuit for comparing said output of the first path generation circuit to the output of the known path generation circuit and for generation of a frequency error signal;

wherein said frequency error signal occurs when first path generation circuit produces the output of a logic level different from the output of said known path generation.

2. An over frequency detection circuit in accordance with claim 1 wherein the first path generation circuit comprises:

a first register coupled to a clock signal;

a logic circuit having an input coupled to an output of the first register for implementing said pathway for transferring a path signal about equal to said longest delay path in said system using said over frequency detection circuit that will allow said system to operate in a known state and still obtain predictable results; and a second register coupled to said clock signal and having an input coupled to an output of the logic circuit and configured and arranged to latck in said path signal.

3. An over frequency detection circuit in accordance with claim 2 wherein the logic circuit comprises a delay circuit for generating a delay path about equal to said longest delay path in said system using said over frequency detection circuit that will allow said system to operate in a known state and still obtain predictable results and wherein the logic circuit is a critical path logic circuit.

4. An over frequency detection circuit in accordance with claim 2 wherein the logic circuit comprises an exact logic implementation of said longest delay path in said system using said over frequency detection circuit that will allow said system to operate in a known state and still obtain predictable results.

5. An over frequency detection circuit in accordance with claim 2 wherein said first register comprises a flip-flop having a first input coupled to said clock signal, an output coupled to the logic circuit, and an inverted output coupled to a second input.

6. An over frequency detection circuit in accordance with claim 2 wherein said second register comprises a flip-flop having a first input coupled to said clock signal, a second input coupled to said output of the logic circuit, and an output coupled to the comparator.

7. An over frequency detection circuit in accordance with claim 1 wherein the known path generation circuit comprises:

a first register coupled to a clock signal;

a logic buffer for implementing a pathway shorter than the pathway of the first path generation circuit; and a second register coupled to said clock signal and having an input coupled to an output of said logic buffer for latching in a known path signal from said logic buffer.

8. An over frequency detection circuit in accordance with claim 7 wherein said logic buffer is a non-inverting buffer when the first path generation circuit is non-inverting circuit.

9. An over frequency detection circuit in accordance with claim 7 wherein said logic buffer is an inverting buffer when the first path generation circuit is an inverting circuit.

10. An over frequency detection circuit in accordance with claim 7 wherein said first register includes a flip-flop having a first input coupled to said clock signal, an output coupled to said logic buffer, and an inverted output coupled to a second input.

11. An over frequency detection circuit in accordance with claim 7 wherein said second register comprises a flip-flop having a first input coupled to said clock signal, a second input coupled to said output of said logic buffer, and an output coupled to the comparator.

12. An over frequency detection circuit in accordance with claim 1 wherein the comparator further comprises decoupling means for decoupling said output signals of the first path generation circuit and said known path generation circuit to ensure that there are no meta-stable events.

13. An over frequency detection circuit in accordance with claim 12 wherein said decoupling means includes a flip flop.

14. An over frequency detection circuit in accordance with claim 1 wherein the comparator further comprises counter means for counting a number of times said output of said first path generation circuit is different from said output of said known path generation circuit and for generating said frequency error signal after a predetermined number of differences are counted by said counter means.

15. An over frequency detection circuit in accordance with claim 1 further comprising a protection circuit having an input coupled to an output of said comparator and an output coupled to an integrated circuit (IC) chip for sending a signal to disable said IC chip when said protection circuit receives said frequency error signal indicating said output of the first path generation circuit is different from said output of said known path generation circuit.

16. An over frequency detection circuit in accordance with claim 15 wherein said protection circuit comprises:

a first flip-flop having a first input coupled to said output of the comparator for receiving said frequency error signal and a second input coupled to said clock signal;

a second flip flop having a first input coupled to an output of said first flip flop and a second input coupled to said clock signal for decoupling said frequency error signal to ensure that there are no meta-stable events; and a third flip flop having an enable input coupled to an output of said second flip flop for sending a signal to disable said IC chip and for continuing to disable said IC chip until a reset signal is sent to said third flip flop to clear said third flip flop.

17. An over frequency detection circuit comprising, in combination:

critical path generation circuit for implementing a pathway about equal to a longest delay path in a system using said over frequency detection circuit that will allow said system to operate in a known state and still obtain predictable results, wherein said critical path generation circuit comprises:

a first register coupled to a clock signal;

critical path logic having an input coupled to an output of said first register for implementing said pathway for transferring a critical path signal about equal to said longest delay path in said system using said over frequency detection circuit that will allow said system to operate in a known state and still obtain predictable results; and a second register coupled to said clock signal and having an input coupled to an output of said critical path logic for latching in said critical path signal transferred from said critical path logic;

known path generation circuit for implementing a shorter pathway than said critical path generation circuit, said known path generation circuit comprises:

a first register coupled to said clock signal;

a logic buffer for implementing a shorter pathway than said critical path generation circuit; and a second register coupled to said clock signal and having an input coupled to an output of said logic buffer for latching in a known path signal transferred from said logic buffer; and a comparator circuit coupled to an output of said critical path generation circuit and to an output of said known path generation circuit for comparing said output of said critical path generation circuit to said output of said known path generation circuit and for generation of a frequency error signal when said output of said critical path generation circuit is different in logic levels from said output of said known path generation circuit, said comparator circuit having a counter means for counting a number of times said output of said critical path generation circuit is different from said output of said known path generation circuit and for generating said frequency error signal after a predetermined number of differences are counted by said counter means.

18. An over frequency detection circuit in accordance with claim 17 wherein said logic buffer includes a non-inverting buffer when said critical path generation circuit is non-inverting circuit.

19. An over frequency detection circuit in accordance with claim 17 wherein said logic buffer includes an inverting buffer when said critical path generation circuit is an inverting circuit.

20. An over frequency detection circuit in accordance with claim 17 further comprising a protection circuit having an input coupled to an output of said comparator circuit and an output coupled to an integrated circuit (IC) chip for sending a signal to disable said IC chip when said protection circuit receives said frequency error signal indicating said output of said critical path generation circuit is different from said output of said known path generation circuit.

21. An over frequency detection circuit in accordance with claim 20 wherein said protection circuit comprises:

a first flip-flop having a first input coupled to said output of said comparator circuit for receiving said freqency error signal and a second input coupled to said clock signal;

a second flip flop having a first input coupled to an output of said first flip flop and a second input coupled to said clock signal for decoupling said frequency error signal to ensure that there are no meta-stable events; and a third flip flop having an enable input coupled to an output of said second flip flop for sending a signal to disable said IC chip and for continuing to disable said IC chip until a reset signal is sent to said third flip flop to clear said third flip flop.

* * * * *

UNITED STATES PATENT AND TRADEMARK OFFICE
CERTIFICATE OF CORRECTION

PATENT NO. : 6,114,880
DATED : September 5, 2000
INVENTOR(S) : Buer et al.

It is certified that error appears in the above-identified patent and that said Letters Patent is hereby corrected as shown below:

Column 5,
Line 30, "latck" should read -- latch --.

Signed and Sealed this

Twentieth Day of November, 2001

Attest:

NICHOLAS P. GODICI
Attesting Officer
Acting Director of the United States Patent and Trademark Office